United States Patent

Lee

[11] Patent Number: 6,160,426
[45] Date of Patent: Dec. 12, 2000

[54] SEMICONDUCTOR MEMORY DEVICE HAVING CLOCK FREQUENCY MULTIPLYING APPARATUS

[75] Inventor: Sok Kyu Lee, Kyoungki-do, Rep. of Korea

[73] Assignee: Hyundai Electronics Industries Co., Ltd., Ichon, Rep. of Korea

[21] Appl. No.: 09/222,188

[22] Filed: Dec. 29, 1998

[30] Foreign Application Priority Data

Dec. 31, 1997 [KR] Rep. of Korea ................... 97-81272

[51] Int. Cl.[7] .................................................. H03B 19/00
[52] U.S. Cl. ........................................ 327/116; 327/119
[58] Field of Search ........................... 327/116, 119–122, 327/356, 291; 341/100

[56] References Cited

U.S. PATENT DOCUMENTS

| 5,388,249 | 2/1995 | Hotta et al. . | |
|---|---|---|---|
| 5,537,660 | 7/1996 | Bond et al. . | |
| 5,548,285 | 8/1996 | Ford et al. | ............... 341/100 |
| 5,777,500 | 7/1998 | Eitrheim . | |
| 5,778,237 | 7/1998 | Yamamoto et al. . | |
| 6,018,305 | 1/2000 | Kikuchi et al. | ........................ 341/100 |

*Primary Examiner*—Kenneth B. Wells
*Attorney, Agent, or Firm*—Jacobson, Price, Holman & Stern, PLLC

[57] ABSTRACT

A clock frequency multiplying apparatus is disclosed. The apparatus includes a clock generator for generating a clock signal, a data input buffer for serially receiving a data, address, instruction, etc. when a transmission clock signal generated by the clock generator is inputted, a data shift register for grouping the data received through the data input buffer into a data packet and, in parallel, transferring the same to a memory, and a clock frequency multiplier for multiplying a transmission clock frequency generated by the clock generator and inputting the same into the data shift register for implementing a fast data transfer by multiplying a clock frequency by dividing the clock signal in an internal circuit of the DRAM into a critical path and a non-critical path by using a transmission clock signal for the critical path and the multiplied clock signal for the non-critical path and enhancing an internal data transfer ratio.

5 Claims, 3 Drawing Sheets

6,160,426

SEMICONDUCTOR MEMORY DEVICE HAVING CLOCK FREQUENCY MULTIPLYING APPARATUS

BACKGROUND OF THE INVENTION

1. Field of the Invention

The present invention relates to a DRAM operated simultaneously with a clock signal in a semiconductor memory, and in particular to a clock frequency multiplying apparatus which is capable of implementing a fast data transfer by multiplying a clock frequency by dividing a clock signal in an internal circuit of the DRAM into a critical path and a non-critical path by using a transmission clock signal for the critical path and a multiplied clock signal for the non-critical path, and enhancing an internal data transfer ratio.

2. Description of the Conventional Art

As shown in FIG. 1, in the RAM bus DRAM, externally inputted data, address and instruction are latched, and a data is controlled in accordance with a clock signal generated by an internal clock generator 1.

Namely, the data which are serially inputted through a data input buffer 2 are processed simultaneously with a clock signal for receiving a predetermined data, and transmitting received data to the memory through a data shift register 3 by a data packet unit.

At this time, the above-described operation is implemented based on a clock phase such as a critical path and a non-critical path.

Therefore, the internal operation of the DRAM is performed using one clock phase, so that the transfer speed and ratio of the data are significantly decreased.

SUMMARY OF THE INVENTION

Accordingly, it is an object of the present invention to provide a clock frequency multiplying apparatus which overcomes the aforementioned problems encountered in the conventional art.

It is another object of the present invention to provide a clock frequency multiplying apparatus which makes it possible to implement a fast data transfer by multiplying a clock frequency by dividing a clock signal in an internal circuit of the DRAM into a critical path and a non-critical path, using a transmission clock signal for the critical path and the multiplied clock signal for the non-critical path and enhancing an internal data transfer ratio.

In order to achieve the above objects, there is provided a clock frequency multiplying apparatus which includes a clock generator for generating a clock signal; a data input buffer for serially receiving a data, address, instruction, etc. when a transmission clock signal generated by the clock generator is inputted; a data shift register for grouping the data received through the data input buffer into a data packet and parallely transferring the same to a memory; and a clock frequency multiplier for multiplying a transmission clock frequency generated by the clock generator and inputting the same into the data shift register.

In the present invention, the internal operation of the DRAM is processed based on a critical path and a non-critical path for multiplying a clock phase in the interior of the DRAM and latching the data using different clock phases to enhance a data transfer ratio.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims as a result of the experiment compared to the conventional arts.

BRIEF DESCRIPTION OF THE DRAWINGS

The present invention will become fully understood from the detailed description given below and the accompanying drawings which are given by way of illustration only, and thus are not limitative of the present invention, and wherein.

DETAILED DESCRIPTION OF THE INVENTION

Figure 1:
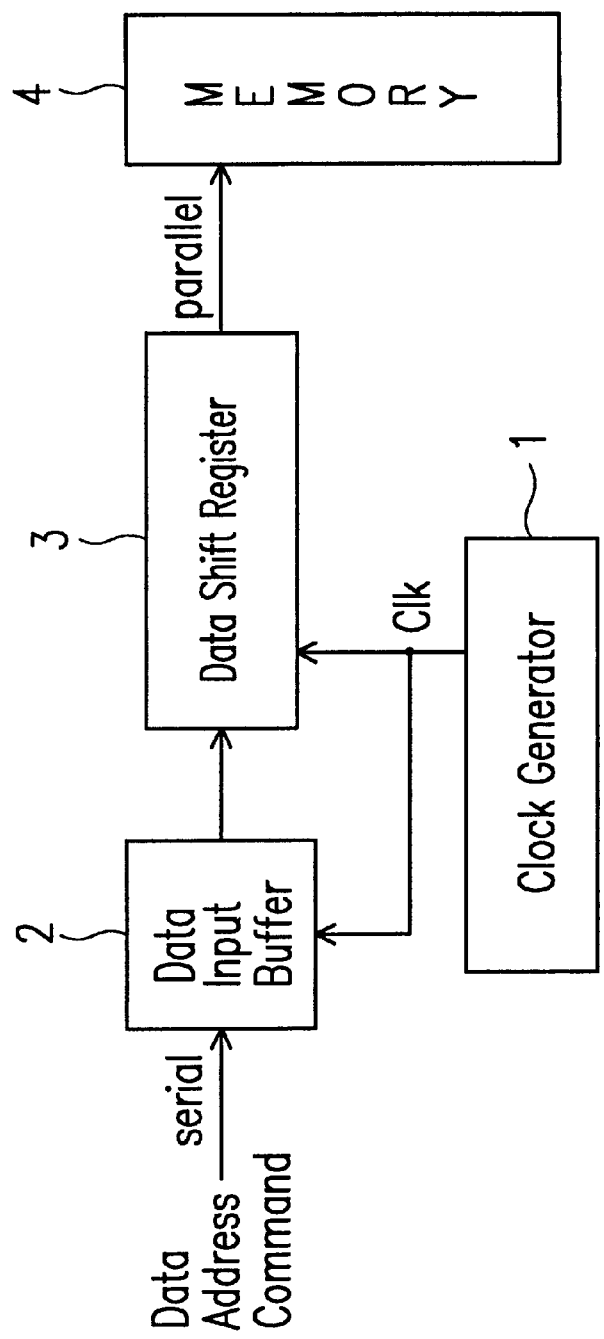
FIG. 1 is a block diagram illustrating a data flow of a conventional DRAM.
Figure 2:
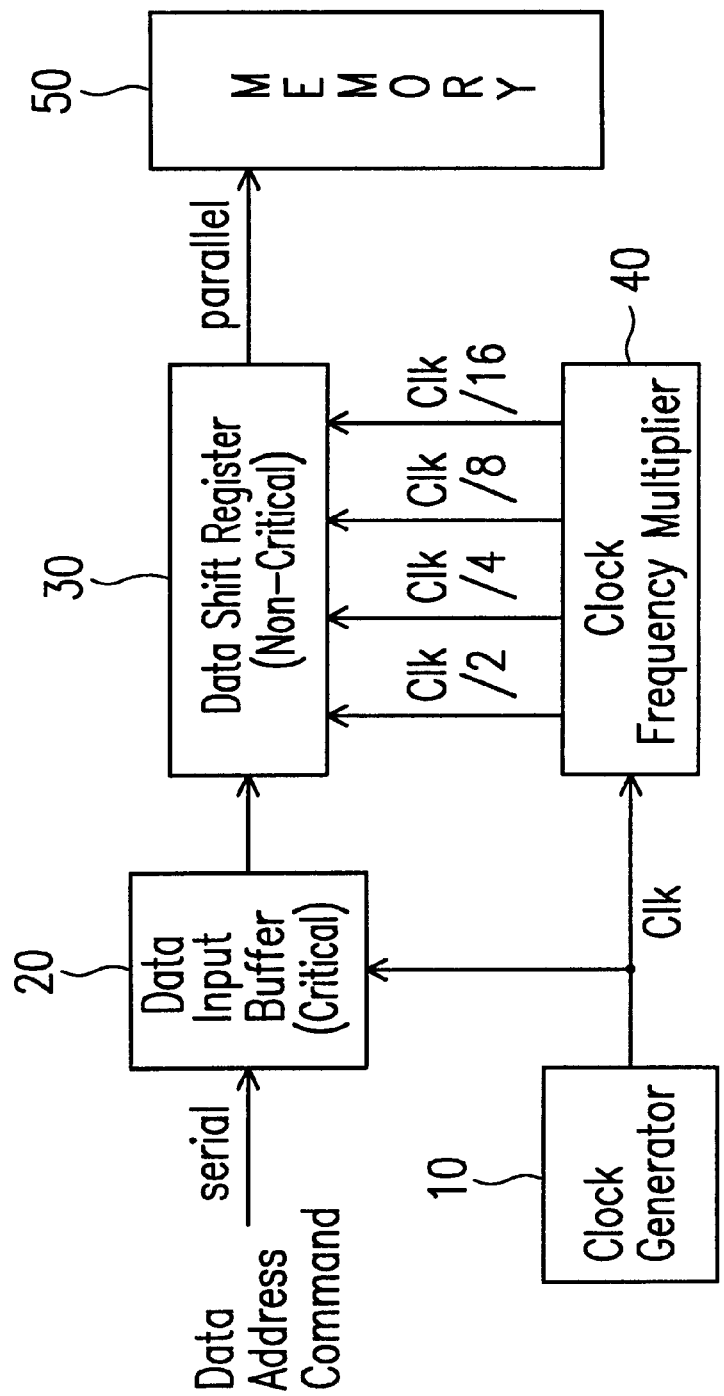
FIG. 2 is a block diagram illustrating a clock frequency multiplying apparatus according to the present invention.

The embodiments of the present invention will be explained with reference to the accompanying drawings.

Data, address and instruction are serially inputted through a data input buffer 20, and thus, inputted data are grouped into a data packet by a data shift register 30 and is, in parallel, transferred to the core of memory 50.

At this time, each block is processed based on a critical path and a non-critical path. It is possible to enable a fast flow of the data using a clock signal obtained by multiplying an original clock frequency from the clock frequency multiplier 40 and a clock signal from a clock generator 10.

Figure 3:
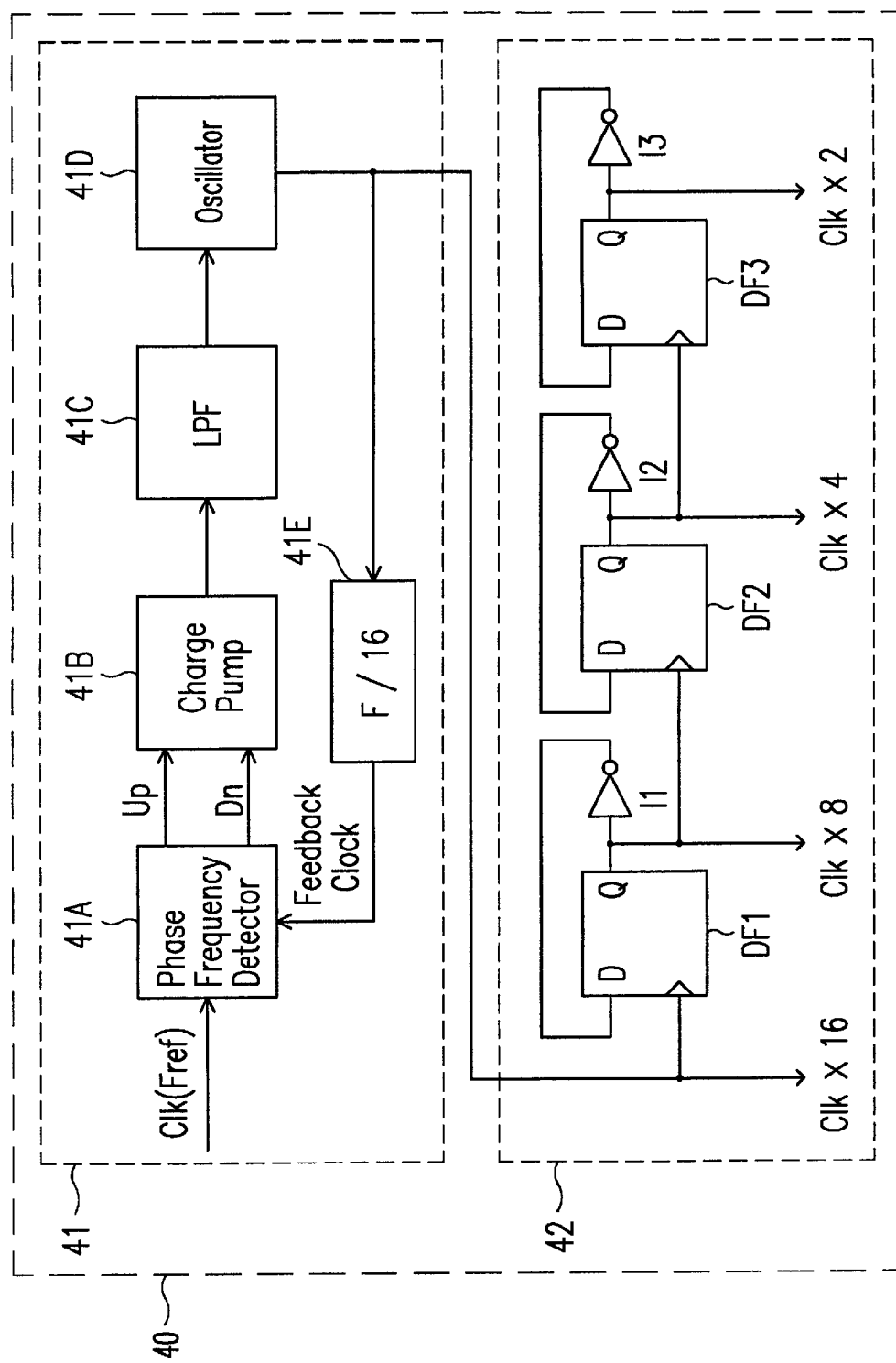
FIG. 3 is a block diagram illustrating the clock frequency multiplier of FIG. 2.

FIG. 3 illustrates the clock frequency multiplier 40 using a PLL(Phase Locked Loop) circuit 41 and a binary counter 42.

The PLL circuit 41 includes a phase frequency detector 41A for comparing the phases of an internal clock signal; a feed-back clock signal and outputting an up/down digital signal; a charge pump 41B for outputting a signal converted into an analog signal in accordance with the length of an active internal of the up/down digital signal outputted from the phase frequency detector 41A; a low pass filter 41C for filtering a low band component of the analog signal outputted from the charge pump 41B; a voltage control oscillator 41D for varying an oscillation frequency in accordance with a voltage controlled by a signal filtered by the low pass filter 41C; and a frequency divider 41E for decreasing the frequency outputted from the voltage control oscillator 41D by 16 times and feeding back to the input of the phase frequency detector 41A.

The binary counter 42 includes Dflip-flops DF1 through DF3 for multiplying a frequency oscillated by the voltage control oscillator 41D of the phase synchronous loop circuit 41 for generating a multiplying clock signal, and inverters I1 through I3 for inverting the outputs from the Dflip-flops DF1 through DF3 and inputting the inverted outputs to the data input terminals of the Dflip-flops DF1 through DF3.

The operation of the clock frequency multiplier 40 formed from the phase synchronous loop circuit 41 and the binary counter 42 will be explained with reference to the accompanying drawings.

First, the phase frequency detector 41A compares the phase of the internal clock signal and the feed-back clock (CLK/16) and outputs a digital output up/down signal.

The output from the charge pump 41B is converted into an analog signal in accordance with the length of the active interval of the up/down signal.

This signal is filtered by the low pass filter 41C and controls the voltage control oscillator 41D. As a result, the frequency of the voltage control oscillator 41D is controlled by an output signal from the charge pump 41B.

The frequency of the output signal from the voltage control oscillator 41D is decreased 16 times by the frequency divider 41E and is fed-back to the input of the phase frequency detector 41A.

The binary counter 42 has a predetermined signal obtained when the phase locking occurs.

Namely, when the phases of the reference frequency clock signal and the feed-back phase are identical based on the PLL circuit 41, a Clk*16 clock signal is generated.

Therefore, the multiplying clocks of Clk*16, Clk*8, Clk*4 and Clk*2 are generated at each path using the input clocks of three Dflip-flops DF1 through DF3.

In the present invention, it is possible to implement a fast data flow using the clock signal obtained by multiplying the original clock frequency and the clock signal from the clock generator 10 for increasing a data transfer ratio in the interior of the chip.

As described above, in the present invention, it is possible to implement a stable operation by dividing a clock signal in the internal circuit of the DRAM into a critical path and a noncritical path and multiplying a clock frequency and implementing a fast data flow using the non-critical path for the multiplied clock signal.

Therefore, in the present invention, a fast data transfer is stably implemented by enhancing an internal data transfer ratio.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A semiconductor memory device having clock frequency multiplying apparatus, comprising:

a clock generator for generating a transmission clock signal;

a data input buffer for serially receiving a data, address and instruction when the transmission clock signal generated by the clock generator is inputted;

a data shift register for grouping the data received through the data input buffer into a data packet and, in parallel, transferring the grouped data to a memory; and a clock frequency multiplier for multiplying the transmission clock signal generated by the clock generator and transferring the multiplied signal to the data shift register.

2. The semiconductor memory device of claim 1, wherein in said clock frequency multiplier, a data flow is divided into a critical path and a non-critical path for implementing a data transfer in an interior of the semiconductor memory device storing a data therein in synchronization with the transmission clock signal, and an oscillation clock signal is used for the critical path for implementing a data latch, and at the same time, a clock signal obtained by multiplying the transmission clock signal is used for implementing a data transfer for the non-critical path.

3. The semiconductor memory device of claim 1, wherein said clock frequency multiplier includes:

a phase synchronous loop circuit for receiving a reference frequency clock signal and a feed-back clock signal; and a binary counter for generating a multiplying clock signal when the phases of the reference frequency clock signal and the feed-back clock signal are identical [by] based on the phase synchronous loop circuit.

4. The semiconductor memory device of claim 3, wherein said phase synchronous loop circuit includes:

a phase frequency detector for comparing the phases of the reference frequency clock signal and the feed-back clock signal and outputting an up/down digital signal;

a charge pump for outputting an analog signal based on a length of an active interval of the up/down digital signal outputted from the phase frequency detector;

a low pass filter for filtering a low band component of the analog signal outputted from the charge pump;

a voltage control oscillator for varying an oscillation frequency based on the signal filtered by the low pass filter; and a frequency divider for decreasing the frequency of an output signal from the voltage control oscillator by 16 times and feeding-back the decreased frequency output signal to an input of the phase frequency detector.

5. The semiconductor memory device of claim 3, wherein said binary counter includes:

a Dflip-flop for multiplying an output signal from the voltage control oscillator of the phase synchronous loop circuit and generating the multiplying clock signal; and an inverter for inverting an output signal from the Dflip-flop and feeding-back the inverted signal to a data input terminal of the Dflip-flop.

* * * * *